March 13, 1962 C. M. CAMPBELL, JR 3,025,417

MONOSTABLE MULTIVIBRATOR FOR GENERATING TEMPERATURE-STABLE PRECISE DURATION PULSES

Filed Aug. 14, 1959

INVENTOR.
CARL M. CAMPBELL, JR.
BY
Francis A. Varallo
AGENT 3,025,417

MONOSTABLE MULTIVIBRATOR FOR GENERATING TEMPERATURE-STABLE PRECISE DURATION PULSES

Carl M. Campbell, Jr., Broomall, Pa., assignor to Burroughs Corporation, Detroit, Mich., a corporation of Michigan Filed Aug. 14, 1959, Ser. No. 833,740
10 Claims. (Cl. 307—88.5)

This invention relates generally to pulse forming circuits and more particularly to a precision temperature-insensitive solid state monostable multivibrator.

Pulse forming circuits are commonplace in the electronics art, and are employed in widely diversified applications. The circuit of the instant invention provides, upon command of an input trigger pulse, an output pulse of any predetermined duration. If desired, the output pulse may be differentiated to obtain a second peaked pulse delayed in time from the initial trigger pulse. In this latter application the instant invention functions as a delay circuit. A variety of present day circuits are available to generate pulses and provide delay. However, the instant circuit is characterized by a unique configuration of solid state electronic components operating in a mode which achieves highly stable output pulse durations over a wide ambient temperature range. Likewise, the stability of the circuit is not appreciably affected by changes in the impedance of the load circuit which utilizes the generated pulses, or by the differences in the electrical parameters normally present in solid state components of the same type.

In the basic monostable or one-shot multivibrator, a capacitive element is charged to a first predetermined voltage level during the quiescent period preceding the occurrence of a trigger pulse. During the active or pulse forming period initiated by the trigger pulse, the capacitive element discharges through a selected value of impedance—the duration of the output pulse delivered by the circuit being a function of the time required for the element to discharge from said first voltage level to a second predetermined voltage level. Satisfactory operation of the circuit requires that only a very small portion of the charge on the capacitive element be lost in circuit functions not directly affecting the discharge time constant. In addition, under certain operating conditions such as increasing ambient temperature, more of the charge on the capacitive element is diverted from the discharge path with the result that the output pulse duration is diminished proportionately. The cause of this increased loss of charge will hereinafter be considered in detail. The circuit of the instant invention utilizes an additional solid state electronic stage arranged such that the loss of charge is minimized and remains substantially constant, thereby insuring precise duration output pulses regardless of variations in temperature and load impedance or inherent differences in the electrical characteristics of the solid state elements.

Accordingly it is a general object of the present invention to provide an improved pulse generating circuit.

Another object of the invention is to provide a pulse forming circuit which utilizes exclusively solid state electronic components.

A further object of the present invention is to provide an electronic circuit which generates pulses of any specified duration.

A more specific object of the invention is to provide an electronic circuit having a mode of operation which insures the generation of output pulses of constant duration over a wide ambient temperature range.

These and other features of the invention will hereinafter become more fully apparent from the following description of the annexed drawing wherein.

Figure 1:
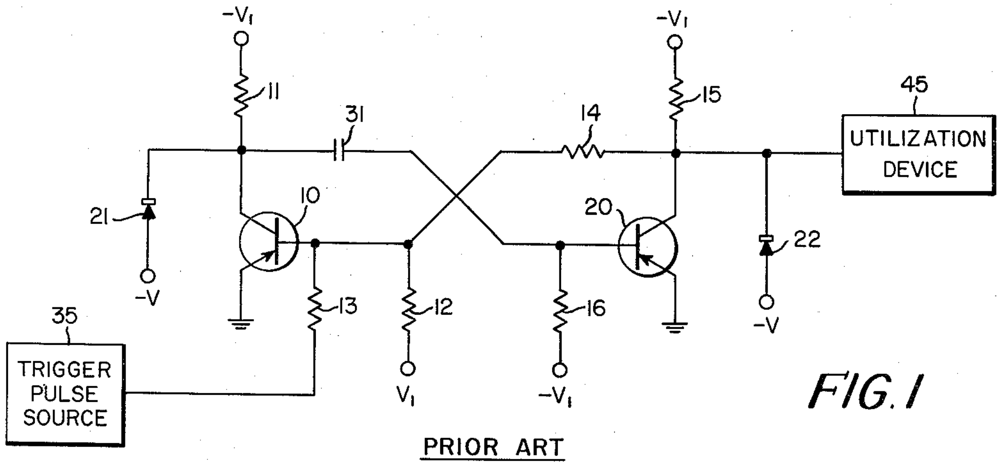
FIG. 1 PRIOR ART
FIG. 1 is a schematic diagram depicting a prior art monostable multivibrator.
Figure 2:
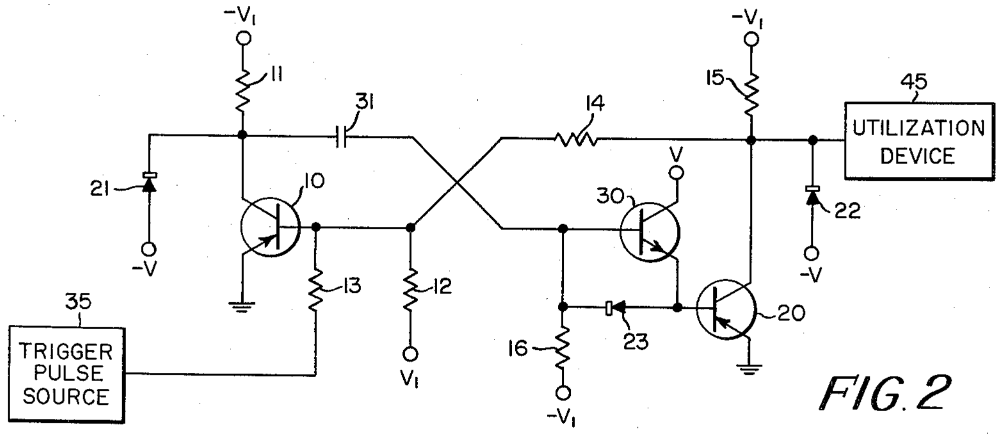
FIG. 2 is a schematic diagram depicting an embodiment of an improved multivibrator circuit in accordance with the instant invention.

In the circuit diagram of FIGS. 1 and 2, conventional graphical symbols have been employed to designate the emitter, collector and base electrodes of each of the transistors. It should be noted that the invention is not restricted to the use of the types of transistors depicted in FIG. 2, but may employ other types in accordance with established design procedures well known to those skilled in the art. The positive and negative supply voltages for the transistors listed respectively in order of increasing absolute magnitude are: V, $V_1$ and —V, $-V_1$. Like reference numerals have been used in the drawing to identify similar components.

The prior art circuit of FIG. 1 consists of two PNP transistors, designated 10 and 20 respectively. The collector of transistor 10 is coupled to the base of transistor 20 by capacitor 31. The collector of transistor 20 is connected via resistor 14 to the base of transistor 10. Resistors 11 and 15 are connected in the collector circuits of transistors 10 and 20 respectively, and resistors 12 and 16, in the respective base circuits thereof. Diodes 21 and 22 serve to clamp the negative voltage level on the collector electrodes of transistors 10 and 20 to the potential of the —V supply. Trigger pulses from source 35 are applied via resistor 13 to the base of transistor 10. Output pulses are obtained on the collector of transistor 20 and delivered to the utilization device 45.

The operation of the circuit of FIG. 1 will be described in order that its temperature dependency and other operational characteristics will become apparent. In the absence of a trigger pulse from source 35 the circuit is in a quiescent state. A positive voltage exists on the base of transistor 10 as a result of the division by resistors 12 and 13 of the potential supplied by sources $V_1$ and pulse source 35. Thus transistor 10 is reverse-biased and is not conducting. Diode 21 clamps the collector voltage of transistor 10 to the —V potential. During this quiescent state transistor 20 is biased to conduction by the potential of supply $-V_1$ and is saturated. Therefore the collector and base of transistor 20 are substantially at the same potential as the emitter electrode thereof, namely, ground level. Capacitor 31 is charged by current flowing from ground into the emitter of transistor 20 and out of the base of transistor 20 through capacitor 31 and resistor 11 to the supply $-V_1$.

The active, or pulse forming, state of the circuit of FIG. 1 is initiated by the application of a trigger pulse from source 35 to the base of transistor 10. This trigger pulse is of the proper amplitude and polarity to turn transistor 10 On and cause it to saturate. The collector of transistor 10 rises from the —V potential to approximately ground level. This positive-going voltage is reflected by capacitor 31 to the base of transistor 20, and turns the latter transistor Off. Capacitor 31 then begins to discharge via resistor 16 to the potential of the $-V_1$ supply. The collector voltage of transistor 20 drops to the clamp supply potential —V. This latter potential is applied through resistor 14 to the base of transistor 10 and maintains the conduction thereof after the input trigger pulse has terminated.

After a time determined by the impedance of resistor 16, capacitor 31 discharges to slightly below ground potential—which level is sufficient to turn transistor 20 On.

The collector of transistor 20 rises from the $-V_1$ potential to ground level, which rise in potential is coupled to the base of transistor 10 and turns the latter transistor Off. The circuit has now returned to its quiescent state and capacitor 31 begins recharging. After a time, depending upon the impedance of resistor 11 and the emitter-to-base junction impedance of transistor 20, capacitor 31 becomes fully charged to the $-V$ potential and the circuit is in condition for the reception of another trigger pulse.

The duration or width of the output pulses generated by the prior art circuit of FIG. 1 decreases significantly with increasing ambient temperatures. It is a well known characteristic of transistors that the D.C. current gain is a nearly linear function of temperature. Since the degree of saturation of transistor 20 during the quiescent period is a function of the D.C. current gain, the emitter-to-base current will be larger at higher temperatures. This higher forward current at elevated temperatures results in a high hole density in the base region of transistor 20. It has been noted in the circuit operation hereinbefore described that the charge on the capacitive element 31 was utilized in two ways: first, in turning transistor 20 Off and, second, in determining the pulse duration by producing current flow through timing resistor 16. When a trigger pulse is applied to the circuit to initiate the pulse forming period, a reverse bias is applied to the emitter-base junction of transistor 20 by capacitive element 31. The minority carriers, which are holes in the base region of transistor 20, are drawn toward the emitter region thereof and for a short time a large base-to-emitter current flows. When the hole density has decayed to its equilibrium value, the reverse current assumes its normal low value. Since the extent of the hole storage is a function of temperature, the magnitude of the spike of reverse current which passes when the large hole space-charge is being drawn to the emitter region of transistor 20 is a function of the ambient temperature. Further, since the reverse current necessary to clear out the holes and turn transistor 20 Off is provided by capacitive element 31, the higher the temperature the more charge will be lost in this manner and less will be available for timing purposes. Therefore it is apparent that increasing temperature causes larger transistor current gains, which in turn result in larger reverse currents needed to turn the saturated transistor Off—the duration of the output pulses varying inversely as the magnitude of the reverse current supplied by the capacitive element.

It is another well known fact that transistors having the same manufacturer's type designation exhibit considerable variations in their D.C. current gain. A similar condition of varying D.C. current gain exists in transistor 20 with changes in the impedance of the utilization device coupled to the collector electrode thereof. Thus the interchange of transistors or variations in the load of the circuit of FIG. 1 will result in variations in the output pulse duration for the reasons hereinbefore considered.

Figure 3:
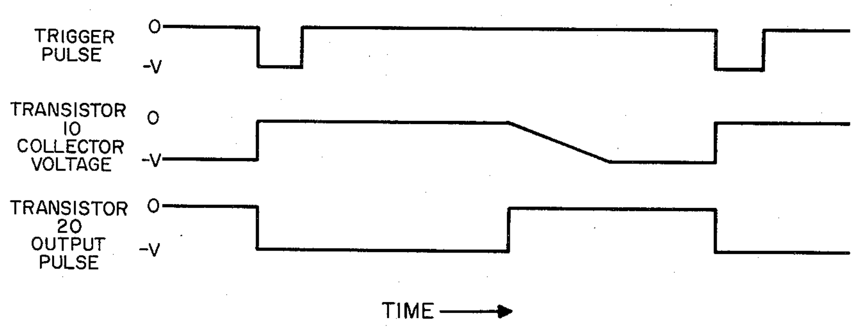
FIG. 3 is a diagram depicting typical voltage waveforms appearing at various points in the circuit of FIG. 2.

The manner in which the instant invention eliminates the aforementioned circuit instability will be apparent from the following description of the circuit embodiment depicted in FIG. 2 when considered in connection with the waveform diagrams of FIG. 3.

The circuit of FIG. 2 differs from that of FIG. 1 in that an NPN transistor stage 30 and a diode 23 have been added. One terminal of capacitor 31 is connected to the base of transistor 30. The collector of transistor 30 is connected to a source of potential V and its emitter electrode is connected to the base of transistor 20. Diode 23 connects the base of transistor 20 to capacitor 31.

In the quiescent state, the circuit of FIG. 2 operates in the same manner as that of FIG. 1. Transistor 10 is Off; transistor 20, On. Current for charging capacitor 31 flows out of the base of transistor 20 and through diode 23, capacitor 31, and resistor 11 to source $-V_1$. Transistor 30 is reverse-biased and is nonconductive—its base being slightly negative with respect to its emitter by the amount of the voltage drop across diode 23. In effect, transistor 30 plays no part in the quiescent circuit operation.

The application of a negative-going trigger pulse from source 35 to the base of transistor 10 turns the latter transistor On and its collector potential rises to approximately ground level, as previously explained. The time and voltage relationships of the trigger pulse and the collector voltage of transistor 10 are illustrated in FIG. 3. This positive-going voltage on the collector of transistor 10 is coupled by capacitor 31 to the base of transistor 30, with the result that transistor 30 is turned On.

The reverse current needed to turn transistor 20 Off is supplied by current flowing out of the emitter of transistor 30 into the base of transistor 20. The base-to-emitter current gain of transistor 30 is such that sufficient current is always available to turn transistor 20 Off regardless of variations in the circuit operating conditions. Because of the current gain of transistor 30 and the fact that the turn-on characteristics thereof are relatively independent of temperature, comparatively little charge is lost by capacitor 31 in turning transistor 20 Off. The charge that is lost in supplying base current for transistor 30 remains substantially constant over wide operating ranges of temperature, utilization circuit impedances, and other operating conditions.

The amplitude of the positive voltage appearing on the base of transistor 30 at the initiation of the pulse-forming period is a function of the voltage pulse rise time on the collector of transistor 10 and the amplitude of the base current of transistor 30. The potential of the collector supply V of transistor 30 may be chosen such that with maximum rise times in transistor 10 and maximum base current in transistor 30, the base of transistor 30 will be driven at least more positive than the potential of the V supply. Hence the potential applied to the base of transistor 30 is limited to the magnitude of the V supply—the collector-base junction being forward biased during the time when the applied potential exceeds that of the V supply. Initially upon the application of a positive-going pulse to the base of transistor 30 the latter transistor conducts heavily. At this time a large base-to-emitter current flows in transistor 20 and the voltage on the emitter of transistor 30 drops to a somewhat lower level than the voltage applied to its base. As the large reverse current in transistor 20 subsides, the voltage on the emitter of transistor 30 approaches the potential on its base and the conduction of transistor 30 is diminished substantially. Subsequently, as capacitor 31 discharges through resistor 16 toward the potential of the $-V_1$ supply, the potential on the base of transistor 30 becomes slightly more negative than ground level. At this point diode 23 becomes forward biased, transistor 20 is turned On, transistors 10 and 30 are turned Off, and circuit recovery commences as capacitor 31 begins recharging. The length of time during which transistor 10 is conducting and transistor 20 is nonconducting, determines the duration of the output pulse which is illustrated in FIG. 3. This output pulse appearing on the collector of transistor 20 is utilized by device 45.

From the foregoing consideration of the operation of the circuit depicted in FIG. 2, it is readily apparent that the configuration of solid state electronic components suggested by the instant invention results in the generation of temperature-stable precise duration pulses. The precision and stability are achieved with simplicity of design and economy of components.

Since other modifications varied to fit particular operating requirements will be apparent to those skilled in the art, the invention is not considered limited to the embodiment chosen for purposes of disclosure, and covers all changes and modifications which do not constitute departures from the true spirit and scope of this invention.

Accordingly, all such variations as are in accord with the principles discussed previously are meant to fall within the scope of the appended claims.

What is claimed is:

1. A pulse forming circuit comprising in combination first, second and third current amplifying devices, a storage element adapted to be charged to a first predetermined potential, an impedance element, a unidirectional current device, a first current path comprising said impedance element, a second current path comprising said storage element, said third current amplifying device and said unidirectional current device, each of said current paths connecting said first and second amplifying devices to each other, said first and third amplifying devices being normally nonconductive and said second amplifying device being normally conductive, said first amplifying device being adapted to be pulsed from a source of trigger pulses and being driven to conduction thereby, the conduction of said first amplifying device conditioning said storage element to initiate the conduction of said third amplifying device, said second amplifying device being driven to nonconduction in response to the conduction of said third amplifying device, circuit means for providing a discharge path for said storage element, said storage element discharging from said first potential to a second predetermined potential, said latter potential being of the proper amplitude and polarity to bias said second amplifying device to conduction, said first and third amplifying devices being driven to nonconduction in response to the conduction of said second amplifying device, and means coupled to said second amplifying device for deriving an output pulse having a duration equal to the time required for said storage element to discharge from said first predetermined potential to said second predetermined potential.

2. A pulse forming circuit comprising in combination first, second and third current amplifying devices, a storage element adapted to be charged to a first predetermined potential, an impedance element, a unidirectional current device, means connecting said first and second amplifying devices and said impedance element in a first direct current path, means connecting said first and second amplifying devices, said storage element, said third amplifying device, and said unidirectional current device in a second alternating current path, said first and third amplifying devices being normally nonconductive and said second amplifying device being normally conductive, said first amplifying device being adapted to be pulsed from a source of trigger pulses and being driven to conduction thereby, said storage element responding to the conduction of said first amplifying device by forward biasing said third amplifying device and initiating the conduction thereof, said second amplifying device being driven to nonconduction in response to the conduction of said third amplifying device, circuit means for providing a discharge path for said storage element, said storage element discharging from said first potential to a second predetermined potential, said latter potential being of the proper amplitude and polarity to bias said second amplifying device to conduction, said first and third amplifying devices being driven to nonconduction in response to the conduction of said second amplifying device, and circuit means connected to said second amplifying device for deriving an output pulse having a duration equal to the time required for said storage element to discharge from said first predetermined potential to said second predetermined potential.

3. A pulse forming circuit comprising in combination first, second and third current amplifying devices, a capacitive element adapted to be charged to a first predetermined potential, a resistive element, a unidirectional current device, said resistive element connecting said first and second amplifying devices in a first current path, a second current path connecting said first and second amplifying devices and comprising in series said capacitive element and the parallel combination of said third amplifying device and said unidirectional current device, said first and third amplifying devices being normally nonconductive and said second amplifying device being normally conductive, said first amplifying device being adapted to be pulsed from a source of trigger pulses and being driven to conduction thereby, the change in potential across said first amplifying device resulting from the conduction thereof being applied by said capacitive element to said third amplifying device, said third amplifying device being biased to conduction by said applied potential, said third amplifying device reverse biasing said second amplifying device and supplying the current necessary to halt the conduction of said latter device, circuit means providing a discharge path for said capacitive element, said capacitive element discharging from said first potential to a second predetermined potential, said latter potential having the proper amplitude and polarity to bias said second amplifying device to conduction, said first and third amplifying devices being driven to nonconduction in response to the conduction of said second amplifying device, and means connected to said second amplifying device for deriving an output pulse having a duration equal to the time required for said storage element to discharge from said first predetermined potential to said second predetermined potential.

4. A pulse forming circuit comprising in combination first, second and third transistors, each of said transistors having an emitter, a collector and a base electrode, a capacitive element adapted to be charged to a first predetermined potential, a resistive element, a unidirectional current device, said resistive element connecting the base of said first transistor to the collector of said second transistor in a first current path, a second current path connecting the collector of said first transistor to the base of said second transistor and comprising in series said capacitive element and the parallel combination of said third transistor and said unidirectional current device, said unidirectional current device being connected between the base and emitter electrodes of said third transistor, the emitter of said third transistor being connected to the base of said second transistor, said first and third transistors being normally nonconductive and said second transistor being normally conductive, said first transistor being adapted to be pulsed from a source of trigger pulses and being driven to conduction thereby, the change in voltage on the collector of said first transistor resulting from the conduction thereof being reflected by said capacitive element to the base of said third transistor, said third transistor being biased to conduction by said reflected voltage, said second transistor being driven to nonconduction as a result of the bias voltage and reverse current supplied to the base electrode thereof by said third transistor, means coupled to the base of said third transistor and to a source of bias potential for providing a discharge path for said capacitive element, the emitter of said second transistor being connected to a second predetermined potential, said second predetermined potential having a value intermediate that of said first predetermined potential and said bias potential, said capacitive element discharging from said first predetermined potential toward said bias potential, the instantaneous voltage on said capacitive element being applied to the base of said second transistor by said third transistor, said second transistor being driven to conduction when said capacitive element has discharged below said second predetermined potential, the conduction of said first and third transistors being terminated in response to the conduction of said second transistor, and means coupled to the collector of said second transistor for deriving an output pulse having a duration equal to the time required for said capacitive element to discharge from said first predetermined potential to said second predetermined potential.

5. A pulse forming circuit as defined in claim 4 wherein said first and second transistors are junction PNP types and said third transistor is a junction NPN type.

6. A monostable multivibrator comprising in combination first, second and third transistors, a capacitor, a resistor, a diode, each of said transistors having an emitter, a collector and a base electrode, said capacitor and resistor each having a pair of terminals, said resistor terminals being connected respectively to the base of said first transistor and the collector of said second transistor, said capacitor terminals being connected respectively to the collector of said first transistor and the base of said third transistor, the emitter of said third transistor being connected to the base of said second transistor, said diode having a pair of electrodes, said diode electrodes being connected respectively to the base electrodes of said second and third transistors, the base of said first transistor being adapted to be pulsed from a source of trigger pulses, and output utilization means connected to the collector electrode of said second transistor.

7. A monostable multivibrator comprising in combination first, second and third transistors, a capacitor, a resistor, a diode, each of said transistors having an emitter, a collector and a base electrode, said capacitor and resistor each having a pair of terminals, said resistor terminals being connected respectively to the base of said first transistor and the collector of said second transistor, said capacitor terminals being connected respectively to the collector of said first transistor and the base of said third transistor, the emitter of said third transistor being connected to the base of said second transistor, said diode having a pair of electrodes, said diode electrodes being connected respectively to the base electrodes of said second and third transistors, the base of siad first transistor being adapted to be pulsed from a source of trigger pulses, said first and third transistors being normally nonconductive and said second transistor being normally conductive, said capacitor being charged to a first predetermined potential by current flow as a result of the conduction of said second transistor, said first transistor being adapted to be pulsed from a source of trigger pulses and being driven to conduction thereby, the change in voltage on the collector of said first transistor resulting from the conduction thereof being coupled by said capacitor to the base of said third transistor, said third transistor being biased to conduction by said coupled voltage, said second transistor being driven to nonconduction as a result of the bias voltage and reverse current supplied to the base thereof by said third transistor, circuit means for providing a discharge path for said capacitor, said capacitor discharging from said first potential to a second predetermined potential, said latter potential having the proper amplitude and polarity to bias said second transistor to conduction, said first and third transistors being driven to nonconduction in response to the conduction of said second transistor, and means connected to the collector electrode of said second transistor for utilizing the output voltage appearing thereon, said output voltage appearing as a pulse and having a duration equal to the time required for said capacitor to discharge from said first predetermined potential to said second predetermined potential.

8. A monostable multivibrator comprising first and second transistors of the same conductivity type, each of said transistors having at least input and output electrodes, impedance means connecting the output electrode of each of said first and second transistors to a source of potential, first means for biasing said first transistor normally Off, second means, including a first resistance, for biasing said second transistor normally On, a second resistance connecting the input electrode of said first transistor to the output electrode of said second transistor, means including a diode and a capacitor connected in series between the input electrode of said second transistor and the output electrode of said first transistor, said diode being poled to offer low impedance to current flow from the input electrode of said second transistor to the output electrode of said first transistor, a third transistor of a conductivity type opposite to that of said first and second transistors, and having at least input and output electrodes, means for connecting the output electrode of said third transistor to a source of potential, means connecting said diode between the input electrodes of said second and third transistors, and means for applying trigger pulses to the input electrode of said first transistor to turn On said normally Off first transistor.

9. A monostable multivibrator comprising first and second transistors of the same conductivity type and a third transistor of the opposite conductivity type, each of said transistors having at least base and collector electrodes, a resistance connecting the base of said first transistor to the collector of said second transistor, means, including a parallel network and a series capacitor, coupling the base of the second transistor to the collector of the first transistor, said parallel network comprising a diode shunted by the base-emitter current path of said third transistor, said diode being poled to offer low impedance to current flow from the base of said second transistor to the collector of said first transistor, impedance means for coupling the collector of each of said first and second transistors to a source of collector voltage, means for biasing said first transistor normally Off, means for biasing said second transistor normally On, means for connecting the collector of said third transistor to a source of collector voltage, and means for applying trigger pulses to the base of said first transistor to turn On said normally Off first transistor.

10. A monostable multivibrator comprising first and second transistors of the same conductivity type, each of said transistors having at least base and collector electrodes, impedance means for connecting the collector of each of said first and second transistors to a source of collector potential, first means for biasing said first transistor normally Off, second means, including a first resistance, for biasing said second transistor normally On, a second resistance connecting the base of said first transistor to the collector of said second transistor, a diode and a capacitor connected in series between the base of said second transistor and the collector of said first transistor, said diode being poled to offer low impedance to current flow from the base of said second transistor to the collector of said first transistor, a third transistor of a conductivity type opposite to that of said first and second transistors and having emitter, base and collector electrodes, means for connecting the collector of said third transistor to a source of collector potential, means connecting the emitter of said third transistor to the base of said second transistor, means connecting the base of said third transistor to the junction point between said series-connected diode and capacitor, and means for applying trigger pulses to the base of said first transistor to turn On said normally Off first transistor, thereby to alter sharply the potential on both sides of said series capacitor, thereby to turn On said third transistor and to cause current to flow through said third transistor to remove minority carriers from the base of said normally conducting second transistor, thereby to cause said second transistor to turn Off, whereby said series capacitor discharges substantially solely through a path comprising said first resistance.

References Cited in the file of this patent

UNITED STATES PATENTS

| | | |
|---|---|---|
| 2,827,574 | Schneider | Mar. 18, 1958 |
| 2,831,113 | Weller | Apr. 15, 1958 |
| 2,880,330 | Linvill et al. | Mar. 31, 1959 |
| 2,923,840 | Ellsworth | Feb. 2, 1960 |